United States Patent
Hayashi

(10) Patent No.: US 8,603,923 B2
(45) Date of Patent: Dec. 10, 2013

(54) DIPPING SOLUTION FOR USE IN PRODUCTION OF SILICEOUS FILM AND PROCESS FOR PRODUCING SILICEOUS FILM USING THE DIPPING SOLUTION

(71) Applicant: Masanobu Hayashi, Kakegawa (JP)

(72) Inventor: Masanobu Hayashi, Kakegawa (JP)

( * ) Notice: Subject to any disclaimer, the term of this patent is extended or adjusted under 35 U.S.C. 154(b) by 0 days.

(21) Appl. No.: 13/920,617

(22) Filed: Jun. 18, 2013

(65) Prior Publication Data

US 2013/0277808 A1 Oct. 24, 2013

Related U.S. Application Data

(62) Division of application No. 12/919,782, filed as application No. PCT/JP2009/053931 on Mar. 3, 2009.

(30) Foreign Application Priority Data

Mar. 6, 2008 (JP) ................. 2008-056198

(51) Int. Cl.
*H01L 21/47* (2006.01)
*H01L 21/471* (2006.01)
*H01L 21/312* (2006.01)
*H01L 21/314* (2006.01)
*H01L 21/3105* (2006.01)
*H01L 21/469* (2006.01)
*B05D 3/02* (2006.01)
*H01L 21/56* (2006.01)
*C01B 15/01* (2006.01)

(52) U.S. Cl.
USPC ........... 438/781; 438/782; 427/337; 427/344; 427/372.2; 427/387; 252/186.28; 252/186.29; 252/186.41; 257/E21.24

(58) Field of Classification Search
USPC ................ 438/781; 427/337, 344, 372.2, 387
See application file for complete search history.

(56) References Cited

U.S. PATENT DOCUMENTS

| | | | | |
|---|---|---|---|---|
| 2,749,291 | A * | 6/1956 | Pierotti et al. | 203/79 |
| 2,819,949 | A * | 1/1958 | Keeler et al. | 203/28 |
| 2,871,101 | A * | 1/1959 | Rust et al. | 423/272 |
| 2,949,343 | A * | 8/1960 | Hood et al. | 203/43 |
| 3,074,782 | A * | 1/1963 | Meeker et al. | 423/584 |
| 6,375,920 | B2 * | 4/2002 | Fischer et al. | 423/584 |
| 2002/0168289 | A1* | 11/2002 | McVey | 422/28 |
| 2004/0037769 | A1* | 2/2004 | Paparatto et al. | 423/584 |
| 2004/0079920 | A1* | 4/2004 | Chadwick et al. | 252/186.26 |
| 2012/0156893 | A1* | 6/2012 | Ozaki et al. | 438/781 |

\* cited by examiner

*Primary Examiner* — Joseph D Anthony
(74) *Attorney, Agent, or Firm* — Sangya Jain

(57) ABSTRACT

This invention relates to a dipping solution used in a process for producing a siliceous film. The present invention provides a dipping solution and a siliceous film-production process employing the solution. The dipping solution enables to form a homogeneous siliceous film even in concave portions of a substrate having concave portions and convex portions. The substrate is coated with a polysilazane composition, and then dipped in the solution before fire. The dipping solution comprises hydrogen peroxide, a foam-deposit inhibitor, and a solvent.

9 Claims, No Drawings

DIPPING SOLUTION FOR USE IN PRODUCTION OF SILICEOUS FILM AND PROCESS FOR PRODUCING SILICEOUS FILM USING THE DIPPING SOLUTION

CROSS-REFERENCE TO RELATED APPLICATION

This application is a divisional application of Ser. No. 12/919,782, filed Aug. 27, 2010, which is related to International Patent Application No. PCT/JP2009/053931 filed Mar. 3, 2009 which is related to Japanese Patent Application No. 2008-056198 filed Mar. 6, 2008, the contents of which are hereby incorporated herein by reference.

TECHNICAL FIELD

This invention relates to a dipping solution used in a process for producing a siliceous film provided in an electronic device, and also relates to the process using the solution for producing a siliceous film. Specifically, the present invention relates to a dipping solution used for forming a shallow trench isolation structure or an insulating film from a polysilazane compound. The shallow trench isolation structure or the insulating film is provided for isolation of electronic parts in manufacture of an electronic device such as a semiconductor element. The present invention also relates to a process for producing the shallow trench isolation structure or the insulating film.

BACKGROUND ART

In an electronic device such as a semiconductor element, semiconductor parts such as transistors, resistors and the like are arranged on a substrate. Those parts must be electrically isolated from each other, and hence among them it is necessary to form an area separating them. This area is referred to as an "isolation area". Hitherto, the isolation area has been generally provided by forming an insulating film selectively on the surface of the semiconductor substrate.

Meanwhile, recently in the field of electronic device technology, the density and the integration degree have been more and more increased. According as the density and the integration degree are becoming higher, it is getting more difficult to form an isolation structure having fineness corresponding to the required integration degree. It is, therefore, desired to provide a new isolation structure satisfying the required fineness. As one of the isolation structures capable of satisfying the requirement, a trench isolation structure is proposed. The trench isolation structure is fabricated by forming fine trenches on a semiconductor substrate and then by filling the trenches with insulating material so as to electrically separate the part positioned on one side from that on the other side of each trench. The structure thus electrically separating the parts can reduce the isolation area, as compared with the conventional insulating film, and accordingly is effective in achieving the integration degree required in these days.

For fabricating the trench isolation structure, a CVD method or a high density plasma CVD method, for example, can be used (see, for example, Patent document 1). However, if the trenches having fineness required in these days, for example, the trenches of 100 nm width or less are filled in according to those methods, some voids are often contained in the filled trenches. These structural defects are liable to deteriorate the physical strength of the substrate and/or to impair the isolation characteristics.

In order to favorably fill the trenches in, it is proposed (for example, in Patent document 1) that a solution of silicon hydroxide was applied on the substrate and then subjected to thermal treatment so as to be converted into silicon dioxide. However, in this method, when the silicon hydroxide is converted into silicon dioxide, the volume shrinkage often caused to form cracks.

For avoiding the cracks, it is also proposed (for example, in Patent documents 1 to 4) to use polysilazane in place of the silicon hydroxide. When the polysilazane is converted into silicon dioxide, its volume shrinkage is less than that of silicon hydroxide. Accordingly, the cracks formed by the volume shrinkage can be avoided. This method comprises the steps of coating a composition containing polysilazane to fill the trenches in, and then treating the coated composition in an oxidizing atmosphere to produce a trench isolation structure made of highly pure and dense silicon dioxide. Since the composition sufficiently penetrates into the trenches, this method has the advantage of forming few voids. However, the present inventors have found that, in producing the trench isolation structure, a siliceous film formed in the above manner is etched so unevenly that the etching rate at the surface is different from that in the trenches. The reason of this is presumed to be as follows. When the polysilazane is converted into silicon dioxide to form the siliceous film, the reaction conditions at the surface are delicately different from those in the trenches. Accordingly, the characteristics of the siliceous film in the trenches are different from those out of the trenches, and also they depend on the depth in the trenches. As a result, the siliceous film is inhomogeneous in terms of the etching rate. This problem is remarkable when the film is subjected to a low temperature treatment, which is often required by restrictions on the device design and/or on the process design. For example, the etching rate is particularly large at positions in trenches having high aspect ratios.

[Patent document 1] Japanese Patent No. 3178412 (paragraph: 0005 to 0016)
[Patent document 2] Japanese Patent Laid-Open No. 9 (1997)-31333
[Patent document 3] Japanese Patent Laid-Open No. 2001-308090
[Patent document 4] Japanese Patent Laid-Open No. 2005-45230

DISCLOSURE OF INVENTION

Problem to be Solved by the Invention

In a film formed by use of conventional techniques, the characteristics thereof in trenches are so inhomogeneous that the deeper the position is, the worse the film characteristics are. Particularly in a film treated at a low temperature or formed in fine trenches of high aspect ratios, the film characteristics are greatly dependent on the depth.

In the state-of-the-art technology, since the densities of circuits on devices are getting more and more increased, it is desired to provide a process capable of forming a homogeneous film even in fine trenches.

Means for Solving Problem

The present invention resides in a dipping solution in which a substrate coated with a polysilazane composition is dipped before firing in a process for producing a siliceous film; comprising hydrogen peroxide, a foam-deposit inhibitor selected from the group consisting of an alcohol, a surfactant and a mixture thereof, and a solvent other than said alcohol.

The present invention also resides in a process for producing a siliceous film, comprising:

a coating step, in which a substrate surface having concave portions and convex portions is coated with a composition containing a polysilazane compound, a dipping step, in which the coated substrate is dipped in the above dipping solution, and a hardening step, in which the dipped substrate is heated so as to convert the polysilazane compound into a siliceous film.

Effect of the Invention

The present invention enables to form a covering film homogeneously in trenches even if the trenches have very high aspect ratios or very narrow widths. According to the present invention, coating type insulating films formed from polysilazane can be still effectively employed even in forming such high aspect ratio trenches as are necessary for the next generation devices. Further, the present invention is free from demerits of a dipping solution because foam deposition is avoided in the dipping solution of the present invention.

BEST MODE FOR CARRYING OUT THE INVENTION

Dipping Solution

In the dipping solution according to the present invention, a substrate coated with a polysilazane composition is dipped before fired in the siliceous film-production process described later. Generally, the polysilazane composition is heated and fired to undergo an oxidation reaction for forming a siliceous film. In the present invention, the composition is treated with the dipping solution of the invention before fired, and thereby the composition filling in the trenches is oxidized to the same degree as that applied on the flat substrate surface and, as a result, a homogeneous siliceous film can be formed.

The dipping solution according to the present invention comprises hydrogen peroxide, a foam-deposit inhibitor, and a solvent. Each component is described below.

(a) Hydrogen Peroxide

Hydrogen peroxide is a well-known oxidizing agent. However, in the present invention, it is not by the hydrogen peroxide in the dipping solution but by firing that the polysilazane is mainly oxidized to form a siliceous film. The hydrogen peroxide plays as an auxiliary role for homogeneously oxidizing the whole coating layer of the polysilazane composition.

In order that the polysilazane coating layer formed on a substrate surface having concave portions and convex portions can be converted into a siliceous film homogeneously even in trenches, it is presumed to be necessary that oxygen sources should be rapidly diffused in the layer independently of its thickness and also that they should be rapidly reacted with the polysilazane. According to the present invention, the polysilazane coating layer is dipped in an aqueous hydrogen peroxide solution to be preliminarily oxidized, and therefore it is thought to be possible to obtain a siliceous film homogeneous even in fine trenches.

Since pure hydrogen peroxide is an unstable liquid, it is generally treated in the form of aqueous solution.

Accordingly, aqueous hydrogen peroxide solution is generally used to prepare the dipping solution of the present invention. Specifically, hydrogen peroxide in the form of aqueous solution is preferably incorporated in the dipping solution so that the resultant solution may contain hydrogen peroxide in a desired concentration. Hydrogen peroxide formed by electrolysis of aqueous ammonium hydrogensulfate solution or by hydrolysis of peroxo acids may be contained in the dipping solution. However, it is easier to employ the aqueous solution.

From the viewpoint of forming a homogeneous film by firing, the dipping solution contains hydrogen peroxide preferably as much as possible. On the other hand, however, for ensuring safety of workers handling the dipping solution, the content of hydrogen peroxide is preferably lower than a certain degree. In view of that, the amount of hydrogen peroxide is preferably 30 to 60 wt %, more preferably 30 to 35 wt % based on the total amount of the components.

(b) Foam-Deposit Inhibitor

The dipping solution of the present invention comprises a foam-deposit inhibitor. In the present invention, the foam-deposit inhibitor in the dipping solution has function of decreasing bubbles deposited on the substrate placed in the solution. If bubbles are attached on the substrate in the dipping solution, they remain even after the substrate is taken out of the solution. Consequently, the remaining bubbles increase the surface area of the substrate. The larger the surface area is, the more easily contaminant such as dust is deposited from air on the surface to cause defects of the resultant siliceous film. The foam-deposit inhibitor in the present invention can prevent bubbles from forming and thereby can improve the quality of the resultant siliceous film. Further, the inhibitor also has function of further homogenizing the siliceous film after fired.

The foam-deposit inhibitor used in the present invention is selected from the group consisting of an alcohol, a surfactant and a mixture thereof. The alcohol and the surfactant may be used singly or in combination. Further, two or more alcohols or surfactants may be selected to use in combination as the above alcohol or surfactant, respectively.

Here, the "alcohol" means a substance derived from a hydrocarbon by replacing at least one hydrogen atom therein with a hydroxyl group. However, in the present invention, the alcohol is preferably a monool, diol or triol derived from a saturated hydrocarbon containing 1 to 3 carbon atoms by replacing hydrogen atoms therein with 1 to 3 hydroxyl groups. There are many alcohols, and they differ from each other in various aspects such as hydrocarbon chains and substituent groups. However, in the present invention, it is preferred for the alcohol to have function of reducing the surface tension so as to prevent foam formation, to have a low boiling point so as not to remain in the resultant siliceous film, and to have low reactivity with other components such as hydrogen peroxide. Accordingly, it is preferred to adopt an alcohol of relatively low molecular weight. Examples of the preferred alcohol include methanol, ethanol, n-propanol, iso-propanol and a mixture thereof.

In the present invention, the foam-deposit inhibitor may be a surfactant. There are known various surfactants, and any of them can be used according to necessity. However, a nonionic surfactant is preferred because it less remains in the resultant siliceous film to impair the characteristics as an insulating film, such as the dielectric constant thereof. One of the preferred surfactants is a polyoxyethylene alkyl ether.

From the viewpoints of reducing deposited bubbles and of forming a homogeneous film by firing, the dipping solution should contain the foam-deposit inhibitor preferably as much as possible. On the other hand, however, for avoiding risk that the resultant siliceous film serving as an insulating film may be contaminated with organic substances, the content of foam-deposit inhibitor is preferably lower than a certain degree. In view of that, if the foam-deposit inhibitor is an alcohol, its content is preferably 1 to 20 wt %, more preferably 1 to 10 wt %. If the foam-deposit inhibitor is a surfactant, particularly, a nonionic surfactant, its content is preferably 0.1 to 20 wt %, more preferably 0.1 to 10 wt %.

(c) Solvent

The dipping solution of the present invention comprises a solvent. The solvent homogeneously dissolves the hydrogen peroxide and the foam-deposit inhibitor described above. If the foam-deposit inhibitor is an alcohol, the alcohol is a liquid capable of serving as the solvent. However, the "solvent" in the present invention does not include the alcohol. In other words, the "solvent" in the present invention is selected from substances other than the above alcohol.

Any solvent can be selected as long as it can dissolve the above components homogeneously, but the solvent is preferably water. Water of high purity such as distilled water or deionized water is preferably used so that impurities may not attach onto the substrate. This means that, if the hydrogen peroxide or the foam-deposit inhibitor is used in the form of aqueous solution, its solvent (namely, water) can be regarded as the solvent of the dipping solution.

The dipping solution of the present invention is prepared by mixing and dissolving the above components homogeneously. In the preparation, there is no restriction on the order of mixing. Since the prepared dipping solution contains relatively unstable hydrogen peroxide, it should be stored in a cool dark place.

Process for Producing a Siliceous Film

The siliceous film-production process according to the present invention comprises (a) coating a substrate surface having concave portions and convex portions with a composition containing a polysilazane compound, (b) dipping the coated substrate in the above dipping solution, and (c) heating the dipped substrate so as to convert the polysilazane compound into a siliceous film.

(a) Coating Step

There is no particular restriction on what material the surface of the substrate is made of. For example, the substrate is a bare silicon wafer or a silicon wafer coated with a thermally oxidized film or with a silicon nitride film. Such a wafer is fabricated to form grooves or holes thereon according to the aimed semiconductor element or the like, and the obtained substrate having concave portions and convex portions is employed in the present invention. The concave portion or the convex portion corresponds to a trench isolation structure or a contact hole, and hence is freely selected according to the necessity.

Particularly in the case where a trench isolation structure is to be formed, it is general to use a silicon substrate provided with an aimed trench pattern. The trench pattern may be formed by any method, and hence it can be formed, for example, in the following manner.

First, a silicon dioxide layer is formed on a silicon substrate by, for example, thermal oxidation. The thickness of the layer is generally 5 to 30 nm.

If necessary, on the formed silicon dioxide layer, a silicon nitride layer is formed by, for example, a low pressure CVD method. The silicon nitride layer serves as a mask in the etching step performed later or as a stop layer in the polishing step described later. The silicon nitride layer generally has a thickness of 100 to 400 nm, if formed.

The formed silicon dioxide or silicon nitride layer is then coated with a photoresist. After dried or hardened according to necessity, the applied photoresist layer is exposed to light and developed to form an aimed pattern. The exposure may be performed in any manner. For example, mask exposure or scanning exposure can be carried out. Also as for the photoresist, any resist can be selected in view of, for example, resolution.

By use of the patterned resist layer as a mask, the silicon nitride layer and the underlying silicon dioxide layer are successively etched to form the aimed pattern in the silicon nitride and silicon dioxide layers.

Subsequently, by use of the patterned silicon nitride and silicon dioxide layers as a mask, the silicon substrate is subjected to dry-etching to form trench isolation grooves.

The widths of the trench isolation grooves are determined by the pattern previously formed by exposure of the photoresist. Trench isolation grooves in semiconductor elements generally have different widths depending on the elements, but their widths are normally 0.02 to 10 μm, preferably 0.05 to 5 μm. Their depths are normally 200 to 1000 nm, preferably 300 to 700 nm. The method of the present invention can homogeneously fill in narrower and deeper grooves than conventional siliceous film-formation methods. Accordingly, the method of the present invention is suitable for forming a narrower and deeper trench isolation structure. Specifically, it is difficult for the conventional siliceous film-formation methods to form a siliceous film homogeneously in deep parts of the grooves of a trench isolation structure having grooves of 0.5 μm or less (particularly 0.1 μm or less) width and of 5 or more aspect ratio. In contrast, the method according to the present invention can form a siliceous film homogeneously even in deep parts of those grooves.

Subsequently, the prepared silicon substrate is then coated with a polysilazane composition, which is a material of the siliceous film, to form a coating layer. The polysilazane composition can be prepared by dissolving any known polysilazane compound in a solvent.

There is no particular restriction on the polysilazane compound used in the present invention, and any polysilazane compound can be selected to use unless it impairs the effect of the invention. It may be either an inorganic polysilazane compound or an organic one. Preferred examples of the inorganic polysilazane compound include: a perhydropolysilazane having a weight average molecular weight of 3000 to 20000 in terms of polystyrene; and another perhydropolysilazane which has a molecular weight of 690 to 200, which contains 3 to 10 number of $SiH_3$ groups, in which element ratios based on the chemical analysis are Si: 59 to 61 wt %, N: 31 to 34 wt % and H, 6.5 to 7.5 wt % and which comprises a straight chain structure having a repeating unit represented by the following formula (I):

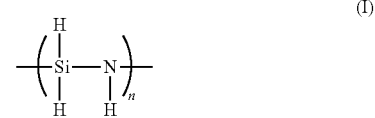

(I)

Other examples of the polysilazane compound include: a polysilazane which has a number average molecular weight of approx. 100 to 50000 and which has a structure mainly comprising a structure unit represented by the following formula (II):

(II)

(in which each of $R^1$, $R^2$ and $R^3$ may independently be hydrogen, an alkyl group, an alkenyl group, a cycloalkyl group, an aryl group, an alkylsilyl group, an alkylamino group, an alkoxy group, or another group such as a fluoroalkyl group which contains a carbon atom directly connecting to the silicon atom, provided that at least one of $R^1$, $R^2$ and $R^3$ may be hydrogen); and modified compounds thereof. Two or more polysilazane compounds can be used in combination.

The polysilazane composition used in the present invention comprises a solvent capable of dissolving the above polysilazane compound. It should be noted that this solvent is different from the solvent used in the aforementioned dipping solution. There is no particular restriction on the solvent as long as it can dissolve the above components. Preferred examples of the solvent include:

(a) aromatic compounds, such as benzene, toluene, xylene, ethylbenzene, diethylbenzene, trimethylbenzene and triethylbenzene; (b) saturated hydrocarbon compounds, such as n-pentane, i-pentane, n-hexane, i-hexane, n-heptane, i-heptane, n-octane, i-octane, n-nonane, i-nonane, n-decane and i-decane; (c) alicyclic hydrocarbon compounds, such as ethylcyclohexane, methylcyclohexane, cyclohexane, cyclohexene, p-menthane, decahydronaphthalene, dipentene and limonene; (d) ethers, such as dipropyl ether, dibutyl ether, diethyl ether, methyl tertiary butyl ether (hereinafter, referred to as MTBE) and anisole; and (e) ketones, such as methyl isobutyl ketone (hereinafter, referred to as MIBK). Among them, more preferred are (b) saturated hydrocarbon compounds, (c) alicyclic hydrocarbon compounds, (d) ethers and (e) ketones.

Those solvents can be used in combination of two or more, so as to control the evaporation rate, to reduce the hazardousness to the human body and to control the solubility of the components.

The polysilazane composition used in the present invention can contain other additives, if necessary. Examples of the optional additives include cross linking accelerators and viscosity modifiers. Further, when used for producing a semiconductor devise, the composition can contain a phosphorus compound such as tris(trimethylsilyl)phosphate for the sake of Na-gettering effect.

The amount of each component described above depends on the aimed use of the composition. However, for forming a sufficiently thick siliceous film, the content of the polysilazane compound is preferably 0.1 to 40 wt %, more preferably 0.5 to 20 wt %, and further preferably 5 to 20 wt %. Normally, if the composition contains the polysilazane compound in an amount of 5 to 20 wt %, the resultant film can have a favorable thickness, for example, of 2000 to 8000 Å.

The above polysilazane composition can be applied on the substrate according to known methods, such as spin coating, dip coating, spray coating, print-transfer coating and the like. Among them, spin coating is particularly preferred.

(b) Dipping Step

Subsequently, the coated substrate may be then subjected to preliminary heating (pre-baking) to remove (to dry) excess organic solvent from the coating layer formed on the substrate surface, if necessary. Thereafter, the substrate is placed in the dipping solution. The preliminary heating does not aim to harden the polysilazane, and hence is carried out generally at a low temperature for a short time, for example, at 70 to 150° C., preferably 100 to 150° C., and for 1 to 10 minutes, preferably 3 to 5 minutes.

There is no particular restriction on temperature of the substrate is placed in the dipping solution, namely, the temperature of the dipping solution. However, it is normally 20 to 50° C., preferably 20 to 30° C. The dipping time depends on various conditions such as the thickness of the coating layer, the kind of the polysilazane compound and the concentration of the dipping solution, but is normally 1 to 30 minutes, preferably 10 to 30 minutes. In this step, bubbles are hardly deposited on the substrate in the dipping solution of the present invention. Accordingly, contaminant such as dust is hardly attached on the substrate surface in the subsequent steps, and hence defects of the resultant substrate can be decreased.

(c) Hardening Step

After the dipping step, the substrate is fired to convert the polysilazane compound on the substrate surface into a siliceous film. The heating procedure is preferably performed in an atmosphere containing steam, oxygen gas or mixed gas thereof, namely, in an oxidative atmosphere. The amount of the oxygen gas is preferably not less than 1 volume %, more preferably not less than 10 volume %. The atmosphere may contain inert gases such as nitrogen and helium unless they impair the effect of the present invention.

If this step is carried out in a steam-containing atmosphere, the amount of steam is preferably not less than 0.1 volume %, more preferably not less than 1 volume %.

In the present invention, it is preferred to fire the substrate in a steam-oxygen mixed gas atmosphere.

The substrate must be heated at such a temperature that the polysilazane compound can be converted into a siliceous film. The temperature is preferably 400 to 1200° C., more preferably 400 to 700° C. The heating time can be properly determined according to the heating temperature, but is normally 0.5 to 5 hours, preferably 0.5 to 1 hour. If the substrate is heated in high moisture atmosphere, the temperature and time necessary for the conversion can be lowered and shortened, respectively.

The process described above forms a homogeneous siliceous film even in concave portions of a substrate. Accordingly, the present invention enables to form a homogeneous siliceous film even in trench isolation grooves of high aspect ratio and consequently to obtain a trench isolation structure of high quality.

EXAMPLES

The below further explains the present invention by use of examples.

First, a perhydropolysilazane was dissolved in dibutyl ether in an amount of 20%, to prepare a polysilazane composition.

The polysilazane composition was then spin-coated at 1000 rpm for 20 seconds on a TEG substrate whose surface was beforehand covered with a silicon nitride liner layer. The obtained coating layer had a thickness of approx. 0.6 μm. The TEG substrate was provided with a line-and-space pattern of, in order, 0.05 μm, 0.1 μm, 0.2 μm, 0.5 μm and 1.0 μm.

Subsequently, the coated substrate was pre-baked on a hot-plate at 150° C. for 3 minutes.

The pre-baked polysilazane layer was dipped for 30 minutes in a dipping solution containing 35% hydrogen peroxide and 10% ethanol, and then post-baked on the hot-plate at 150° C. for 3 minutes. The obtained layer was observed by FT-IR, to find an absorption peak assigned to Si—O bond at 1080 cm$^{-1}$.

After post-baked, the substrate was placed in a cure furnace under a pure oxygen atmosphere while the temperature thereof was kept at 200° C. Thereafter, the temperature was raised at 10° C./minute to 400° C., at which the substrate was heated to harden the layer for 30 minutes in an 80% steam-containing oxygen atmosphere. The thickness of the resultant film was measured to calculate the volume shrinkage ratio of the coating layer converted into the siliceous film. The results are as follows.

Layer not treated with the dipping solution: 16.9%
Layer treated with the dipping solution: 8.0%

Evaluation of Film Characteristics

After all the steps are completed, the substrate coated with the film was cut perpendicularly to the longitudinal direction of the grooves. Subsequently, after dipped at 23° C. for 30 seconds in a 0.5 wt % aqueous hydrofluoric acid solution, the substrate was washed well with pure water and dried. The deepest parts in the grooves appearing on the section of the obtained substrate were observed by SEM having a magnification of 50000 at an elevation angle of 30° with the direction perpendicularly to the section, to evaluate the etched amount. As a result, if the substrate was not treated with the dipping solution, the bottoms of the trenches were found to be etched with a great degree that the film was inhomogeneous in the inside of the trenches. In contrast, if the substrate was treated with the dipping solution, the bottoms of the trenches were found to be etched a little. The formed film was homogeneous even in the trenches.

Evaluation of Foam Deposition

In the same manner as described above, a TEG substrate was coated with the polysilazane composition and pre-baked. The substrate was then placed in the dipping solution. After five minutes from the contact with the dipping solution, bubbles deposited on the substrate surface were counted. In this evaluation, two dipping solutions were used. One comprised 30% hydrogen peroxide and 10% ethanol (Example), and the other is a 30% aqueous hydrogen peroxide solution not containing ethanol (Comparative Example). The results were as set forth in Table 1.

Evaluation of Defect Number after Fired

After the foam deposition was evaluated, the dipped TEG substrates of Example and Comparative Example were fired at 400° C. for 30 minutes in an 80% steam atmosphere. Thereafter, number of defects formed on the surfaces of the fired TEG substrates was evaluated by means of a defect inspection system (KLA-2115 [trademark], manufactured by KLA-Tencor Corp.). Independently, the substrate not treated with the dipping solution was also subjected to the same evaluation by way of reference. The results were as set forth in Table 1.

TABLE 1

| | Dipping solution | Bubbles in dipping solution (number/cm$^2$) | Defects after dipping (number/cm$^2$) | Defects after firing (number/cm$^2$) |
|---|---|---|---|---|
| Example | containing ethanol | 0 | 1 | 3 |
| Comparative Example | not containing ethanol | 2 | 4 | 22 |
| Reference Example | — | — | 15 | 60 |

The invention claimed is:

1. A process for producing a fired siliceous film, comprising;
   i) a coating step, in which a substrate surface having concaved portions and convex portions is coated with a composition containing a polysilazane compound,
   ii) a dipping step, in which the coated substrate is dipped in a dipping solution comprising hydrogen peroxide, a foam-deposit inhibitor selected from the group consisting of 1 to 20 weight % alcohol, 0.1 to 20 weight % surfactant and a mixture thereof, and a solvent other than said alcohol, wherein the hydrogen peroxide is in the range of 30 to 60 weight % of the total amount of components,
   iii) a non-hardening heating step in which the dipped substrate is heated at a temperature lower than that of the hardening step temperature for a shorter time to produce a non-hardened polysilazane film,
   iv) a hardening heating step in which the non-hardened polysilazane film is heated at a higher temperature than the non-hardening step for a longer time to convert the non-hardened polysilazane film to a fired siliceous film.

2. The process according to claim 1 for producing a fired siliceous film, wherein the substrate is heated in the hardening step under an inert gas or oxygen gas atmosphere containing steam in a concentration of 1% or more.

3. The process according to claim 1 for producing a fired siliceous film, wherein the substrate is heated in the hardening step at a temperature of 400° C. to 1200° C. for 0.5 to 5 hour.

4. The process according to claim 1 for producing a fired siliceous film, wherein the substrate is heated in the hardening step at a temperature of 400° C. to 1200° C. for 0.5 to 1 hour.

5. The process according to claim 1 for producing a fired siliceous film wherein the dipping solution comprises hydrogen peroxide in the range of 30 to 35 weight % of the total amount of components.

6. The process according to claim 1 for producing a fired siliceous film wherein the polysilazane film is heated in the non-hardening step after dipping at a temperature between 70 and 150° C. for 1 to 10 minutes.

7. The process according to claim 1 for producing a fired siliceous film wherein in the dipping solution said alcohol is 1 to 10 wt %.

8. The process according to claim 7 for producing a fired siliceous film wherein the alcohol in the dipping solution is ethanol.

9. The process according to claim 1 for producing a fired siliceous film wherein the dipping solution comprises 1 to 10 wt % ethanol and the hydrogen peroxide is in the range of 30 to 35 weight % of the total amount of components and further where the preliminarily heating step is 70 and 150° C. for 1 to 10 minutes and the hardening step is done at 400° C. to 1200° C. for 0.5 to 1 hour.

* * * * *